(12) United States Patent
Baicry et al.

(10) Patent No.: US 10,107,845 B2
(45) Date of Patent: Oct. 23, 2018

(54) DEVICE FOR MEASURING AN ELECTRIC FIELD IN A CONDUCTING MEDIUM AND METHOD OF CALIBRATING SUCH A DEVICE

(71) Applicant: Commissariat â l'Energie Atomique et aux Energies Alternatives, Paris (FR)

(72) Inventors: Mathieu Baicry, Sassenage (FR); Matthieu Le Prado, Saint-Marcellin (FR)

(73) Assignee: COMMISSARIAT A L'ENERGIE ATOMIQUE ET AUX ENERGIES, Paris (FR)

( * ) Notice: Subject to any disclaimer, the term of this patent is extended or adjusted under 35 U.S.C. 154(b) by 351 days.

(21) Appl. No.: 15/045,445

(22) Filed: Feb. 17, 2016

(65) Prior Publication Data
US 2016/0238646 A1    Aug. 18, 2016

(30) Foreign Application Priority Data

Feb. 17, 2015   (FR) ...................................... 15 51297

(51) Int. Cl.
  *G01R 33/09*   (2006.01)
  *G01R 29/12*   (2006.01)
  *G01R 29/08*   (2006.01)
  *G01R 35/00*   (2006.01)
  *G01V 3/08*    (2006.01)

(52) U.S. Cl.
  CPC ......... *G01R 29/12* (2013.01); *G01R 29/0878* (2013.01); *G01R 35/00* (2013.01); *G01V 3/088* (2013.01)

(58) Field of Classification Search
  CPC ...... G01R 33/09; G01R 33/07; G01R 33/093; G01R 33/0017; G01R 33/0029; G01R 33/0094; G01R 33/02; G01R 33/072
  USPC ....... 324/300, 319, 331, 345, 389, 381, 463, 324/207.21, 210–232, 750.12, 750.21, 324/754.17, 754.29, 174
  See application file for complete search history.

(56) References Cited

U.S. PATENT DOCUMENTS

| | | | |
|---|---|---|---|
| 3,641,427 A | 2/1972 | Pittman et al. | |
| 4,496,827 A * | 1/1985 | Sturdevant | H01T 19/04 165/96 |
| 5,583,528 A * | 12/1996 | Ebihara | G09G 3/20 345/212 |

(Continued)

FOREIGN PATENT DOCUMENTS

WO      2008121796 A2    10/2008

OTHER PUBLICATIONS

Voltage, University of Colorado at Boulder Sep. 14, 2009.*
Preliminary Search Report filed in FR 15/51297 dated Jan. 18, 2016; 2 pgs.

*Primary Examiner* — Jermele M Hollington
*Assistant Examiner* — Taqi Nasir
(74) *Attorney, Agent, or Firm* — Moreno Intellectual Property Law LLC

(57) ABSTRACT

A device for measuring an electric field in a conducting medium, including: two electrodes separated by a volume of an insulating material; a current measurement device; a voltage measurement device; and a switch enabling to alternately connect the current measurement device and the voltage measurement device between the electrodes.

4 Claims, 1 Drawing Sheet

(56) References Cited

U.S. PATENT DOCUMENTS

| | | | | |
|---|---|---|---|---|
| 7,116,097 B2* | 10/2006 | Revankar | ............ | F15B 15/2846 |
| | | | | 324/207.13 |
| 7,250,757 B1* | 7/2007 | Tiernan | .............. | G01N 27/9046 |
| | | | | 324/228 |
| 8,120,356 B2* | 2/2012 | Agarwal | ........ | G01B 31/318511 |
| | | | | 324/300 |
| 9,867,265 B2* | 1/2018 | Sato | ...................... | G03B 21/006 |
| 2011/0270066 A1* | 11/2011 | Gregory | ................. | A61B 5/053 |
| | | | | 600/373 |
| 2012/0134549 A1* | 5/2012 | Benkley, III | ........... | G01N 27/04 |
| | | | | 382/124 |
| 2012/0161774 A1* | 6/2012 | Strack | .................... | G01V 3/083 |
| | | | | 324/332 |
| 2013/0193927 A1* | 8/2013 | Schaefer | ............... | H01M 10/48 |
| | | | | 320/128 |
| 2013/0338473 A1* | 12/2013 | Bohorquez | ............ | A61B 5/053 |
| | | | | 600/393 |
| 2014/0234786 A1* | 8/2014 | Ruiz | ....................... | F23C 15/00 |
| | | | | 431/2 |

* cited by examiner

DEVICE FOR MEASURING AN ELECTRIC FIELD IN A CONDUCTING MEDIUM AND METHOD OF CALIBRATING SUCH A DEVICE

This application claims the priority benefit of French Patent application number 15/51297, filed on Feb. 17, 2015, the contents of which is hereby incorporated by reference in its entirety to the maximum extent allowable by law.

BACKGROUND

The present application relates to a device for measuring an electric field in a conducting medium. It particularly applies to undersea electric field measurements.

DISCUSSION OF THE RELATED ART

An offshore electric field measurement device, or sea electrometer, comprising two submerged electrodes distant by a distance l, connected to a voltage measurement device, has already been provided. To measure an electric field E in the area located between the two electrodes, voltage U between the electrodes is measured. Field E can be deduced from this measurement by formula E=U/l. Electrometers of this type are called "voltage measurement" electrometers.

A disadvantage of voltage-measurement electrometers is that due to the relatively high impedance of the voltage-measurement device, only a very small portion of the current propagating in the conducting medium formed by the sea water is deviated in the voltage measurement device, which raises metrology problems. Further, voltage measurement electrometers are generally bulky. Indeed, to obtain a satisfactory signal-to-noise ratio, distance l separating the two electrodes should be relatively large, typically in the range from a few meters to a plurality of kilometers.

To overcome these disadvantages, another type of device of electric field measurement in a conducting medium, called "current measurement" device, which determines the density of current generated, under the effect of the electric field, in a fixed conducting medium volume, is provided.

A device of this type is for example described in French patent N°9102273 of the applicant.

Devices of this type, which will be called current measurement electrometers, may be more compact than voltage measurement electrometers, and may further have a better sensitivity, as well as a better signal-to-noise ratio, particularly to measure electric fields in low frequency bands, typically in frequency bands in the range from 0 to 10 Hz.

The present application more specifically relates to current measurement electrometers. It would indeed be desirable to improve certain aspects of existing current measurement electrometers.

SUMMARY

Thus, an embodiment provides a device for measuring an electric field in a conducting environment, comprising: two electrodes separated by a volume of an insulating material; a current measurement device; a voltage measurement device; and a switch enabling to alternately connect the current measurement device and the voltage measurement device between the electrodes.

According to an embodiment, the device comprises a control and processing unit capable of implementing a calibration method comprising the steps of: a) controlling the switch to connect the current measurement device between the electrodes, and measuring current I between the electrodes by means of the current measurement device; and b) controlling the switch to connect the voltage measurement device between the electrodes, and measuring voltage ΔV between the electrodes by means of the voltage measurement device.

According to an embodiment, the calibration method further comprises calculating an electric field value E from voltage ΔV measured at step b) by formula E=ΔV/L, L being the distance between electrodes, and calculating a proportionality coefficient β between field E and current I measured at step a).

According to an embodiment, during a calibration phase, steps a) and b) are periodically repeated a plurality of times.

According to an embodiment, the frequency at which steps a) and b) are repeated is in the range from 1 to 1,000 Hz.

According to an embodiment, the processing unit is further capable, during an electric field measurement phase, of controlling the switch to connect the current measurement device between the electrodes, of measuring current I between the electrodes by means of the current measurement device, and of deducing from current I the electric field E of the conducting medium according to a previously-determined proportionality ratio.

According to an embodiment, the switch is a mercury switch.

According to an embodiment, the switch is a transistor.

According to an embodiment, the current measurement device comprises a coil connecting the electrodes and a magnetometer capable of measuring the magnetic field induced by the flowing of a current through the coil.

The foregoing and other features and advantages will be discussed in detail in the following non-limiting description of specific embodiments in connection with the accompanying drawings.

DETAILED DESCRIPTION

Figure 1:
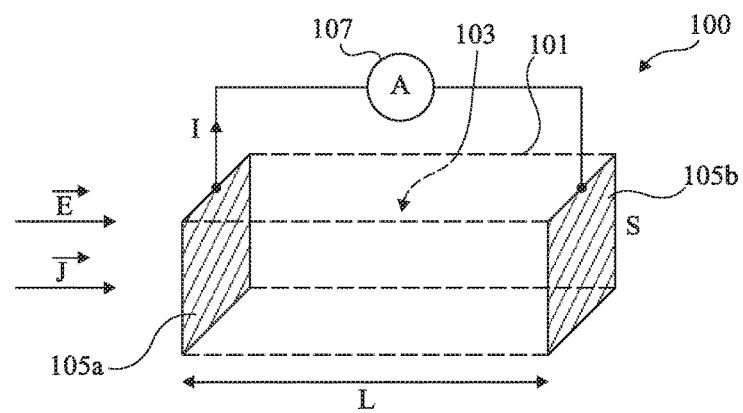
FIG. 1 schematically illustrates an example of a current measurement electrometer.

The same elements have been designated with the same reference numerals in the different drawings and, further, the various drawings are not to scale. Further, in the following description, unless otherwise specified, expressions "approximately", "substantially", and "in the order of" mean to within 10%, preferably to within 5%.

FIG. 1 schematically illustrates an example of a current measurement electrometer 100 intended to be placed in a conducting medium where an electric field is desired to be measured, for example, sea water. Device 100 comprises a tightly closed enclosure 101, shown in dotted lines in the drawing, delimiting a volume 103 of an insulating medium, for example, air or vacuum. Two electrodes 105a and 105b are arranged outside of enclosure 101, so that each electrode has a surface in contact with the conducting medium when the electrometer is submerged. In this example, the two electrodes 105a and 105b are approximately planar and parallel to each other, have substantially the same surface area S, and are separated by a distance L. Electrodes 105a and 105b are for example arranged on opposite external walls of the enclosure. As an example, enclosure 101 has the general shape of a tube portion of cylindrical or rectangular cross-section, the electrodes being arranged on the transverse end surfaces of the enclosure. A current measurement device 107 connects the two electrodes. As a non-limiting example, current measurement device 107 comprises a coil having current I channeled by electrodes 105a and 105b flowing therethrough, and a magnetometer capable of measuring the magnetic field induced by the flowing of current I through the coil. The measurement of the magnetic field induced by the flowing of current I through the coil enables to determine the value of current I. As a variation, the current measurement system may comprise an assembly comprising a transformer and an amplifier, an ammeter, etc.

In operation, electrometer 100 is submerged in a conducting medium, for example, sea water, submitted to an electric field E which is desired to be measured. Under the effect of electric field E, a current of density $\sigma_e *E$ flows through the conducting medium, $\sigma_e$ designating the electric conductivity of the conducting medium. At the electrometer level, a current of density $J=\alpha*\sigma_e*E$ flows between electrodes 105a and 105b, $\alpha$ being a coefficient depending on the ratio of electric conductivity $\sigma_c$ of the electrometer to electric conductivity $\sigma_e$ of water, with $\sigma_c=L/(S*Z_c)$, $Z_c$ designating the impedance of the electrometer, with $Z_c=Z_{elec}+Z_{int}$, $Z_{elec}$ being the impedance of the electrometer electrodes, and $Z_{int}$ being the impedance of the element(s) connected between the electrodes, including at least current measurement device 107. In particular, $\alpha$ is equal to 1 if electrometer 100 is such that its electric conductivity $\sigma_c$ is identical to conductivity $\sigma_e$ of the conducting medium, that is, if electrometer 100 is such that its impedance is equal to that of the slice of conducting medium to which it substitutes. As an example, the inventors have determined that for an electrometer comprising an insulating enclosure in the shape of a straight cylinder of radius R and of length L having its electrodes arranged on the two opposite circular surfaces of the enclosure, parameter $\alpha$ can be expressed as follows:

$$\alpha = \frac{\sigma_c}{\sigma_e} + \frac{1 - \frac{\sigma_c}{\sigma_e}}{1 + 1.24\frac{\sigma_c}{\sigma_e}\left(\frac{L}{R}\right)^{0.90}}.$$

More generally, parameter $\alpha$ may be determined by calculation or empirically whatever the shape of the electrometer.

Electrodes 105a and 105b enable to channel current density J. Channeled current I flowing through electrodes 105a and 105b is equal to I=S*J. Current I may be measured by current measurement device 107.

Conductivity $\sigma_e$ of the conducting medium where electrometer 100 is used is assumed to be known and, knowing the characteristics of the electrometer, coefficient $\alpha$ may be determined. Electric field E can then be deduced from the measurement of current I by formula $E=I/(S*\alpha*\sigma_e)$. The electrometer may comprise processing means, not shown, capable of determining electric field E from the measurement of current I.

A disadvantage of electrometer 100 is that, in practice, conductivity $\sigma_e$ of the conducting medium may be variable and/or may vary between two measurements, for example, when the salt concentration of the sea water varies when the electrometer is used in a marine environment. Further, electrodes 105a and 105b may alter over time, which may cause a modification of their impedance, and thus a modification of the impedance of the electrometer. In such conditions, the proportionality coefficient $\beta=S*\alpha*\sigma_e$ used by the electrometer to determine electric field E from current measurement I is no longer valid, which causes measurement errors.

It would be desirable to have a current measurement electrometer capable of being easily calibrated in its environment of use, to be able to provide accurate electric field measurements, including in the case of a variation of the electric conductivity of the conducting medium being studied, or of the impedance of the electrometer electrodes.

Figure 2:
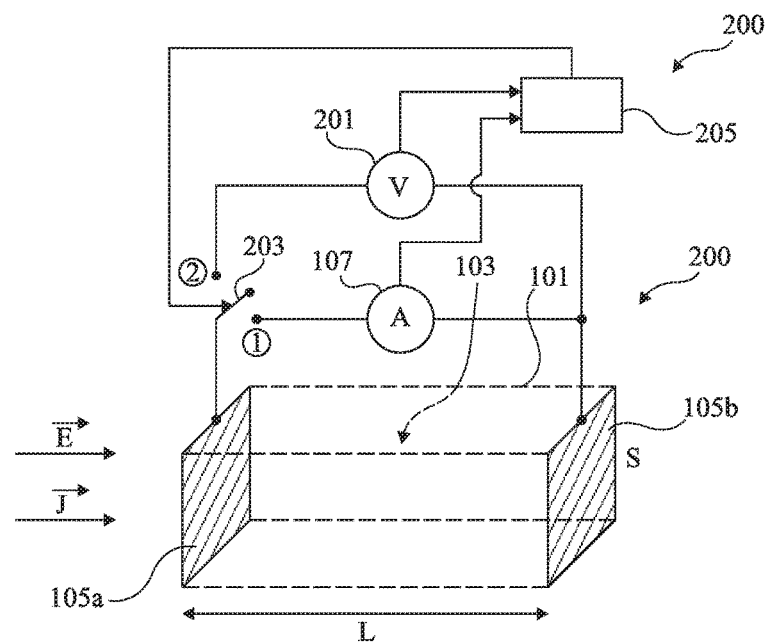
FIG. 2 schematically illustrates an embodiment of a current measurement electrometer.

FIG. 2 schematically illustrates an example of a current measurement electrometer 200 intended to be submerged in a conducting medium where an electric field is desired to be measured, for example, sea water. Electrometer 200 of FIG. 2 comprises elements common with electrometer 100 of FIG. 1. These elements and their operation will not be detailed again hereafter. In the following, only the differences between electrometer 200 of FIG. 2 and electrometer 100 of FIG. 1 will be highlighted.

According to an aspect of an embodiment, a current measurement electrometer comprising, in addition to current measurement device 107 capable of measuring the current flowing between electrodes 105a and 105b, a voltage measurement device 201 capable of measuring the voltage between electrodes 105a and 105b, is provided.

Electrometer 200 further comprises a switch 203 enabling to alternately connect current measurement device 107 and voltage measurement device 201 between electrodes 105a and 105b. In operation, only one of the two measurement devices 107 and 201 is connected between electrodes 105a and 105b at a given time. In the shown example, switch 203 is a switch with two positions respectively designated with reference numerals 1 and 2. In position 1, current measurement device 107 is connected between electrodes 105a and 105b and voltage measurement device 201 is disconnected from electrode 105a and, in position 2, voltage measurement device 201 is connected between electrodes 105a and 105b and current measurement device 107 is disconnected from electrode 105a. Preferably, switch 203 has a low on-state resistance. As an example, switch 203 is a mercury switch, or a transistor.

Electrometer 200 further comprises a processing and control unit 205 capable of reading and processing measurements provided by measurement devices 107 and 201, and of controlling switch 203.

During an electric field measurement phase, switch 203 is maintained at position 1, that is, voltage measurement device 201 is disconnected. Electrometer 200 then operates as a usual current measurement electrometer. Processing unit 205 may be used to determine electric field E from the measurement of current I channeled by electrodes 105a, 105b. The proportionality coefficient $\beta=S*\alpha*\sigma_e$ used to determine electric field E based on a measurement of current I may having been previously determined during an electrometer calibration phase.

According to an aspect of an embodiment, a method of calibrating electrometer 200 is provided, where one or a plurality of voltage measurements are performed by means of device 201, to calibrate the current measurement system and particularly to determine the proportionality coefficient $\beta$ enabling to determine electric field E based on a measurement of current I performed by device 107 when the switch is at position 1.

As an example, during a phase of calibration of electrometer 200, the following steps are implemented by processing and control unit 205.

At a first step, switch 203 is controlled to position 1, and a measurement of current I channeled by electrodes 105a, 105b is performed by means of measurement device 107.

At a second step, switch 205 is controlled to position 2, and an electric field value E is determined by voltage measurement by means of voltage measurement device 201. During this step, field E is deduced from voltage $\Delta V$ measured by device 201 between electrodes 105a and 105b by formula $E=\Delta V/L$.

To maximize the signal-to-noise ratio, the two steps may be periodically repeated for some time, for example, for a period in the range from 1 min to 1 h, at a frequency sufficient to measure signals I and E at the desired frequencies, that is, at a frequency at least twice greater than the highest frequency at which field E is desired to be measured, for example, at a frequency in the range from 1 to 1,000 Hz.

The value of coefficient $\beta$ is then determined by calculating the ratio between signals I and E respectively measured by means of current measurement device 107 and by means of voltage measurement device 201.

Once coefficient $\beta$ has been determined, switch 203 may be set back to position 1. The electrometer calibration is then finished, and electric field measurements may be carried out by means of current measurement device 107 alone, by using the new coefficient $\beta$ to determine field E from a measurement of current I by device 107.

The calibration method may be repeated as often as necessary to avoid for the possible drift of the impedance parameters of electrodes 105a, 105b and of conductivity $\sigma_e$ to cause a significant degradation of the electrometer accuracy.

An advantage of the described embodiments is that the calibration may be performed in situ, that is, without having to extract the electrometer from the studied medium, and without having to perform complex measurements of electric conductivity $\sigma_e$ of the studied medium and of electric conductivity $\sigma_c$ of the electrometer.

Specific embodiments have been described. Various alterations, modifications, and improvements will readily occur to those skilled in the art.

In particular, it will be within the abilities of those skilled in the art to implement the desired operation by using other arrangements of switch 203 than that shown in FIG. 2.

Further, the described embodiments may be adapted to current measurement electrometers comprising a plurality of pairs of electrodes oriented in different directions and enabling to perform electric field measurements in a plurality of directions of space.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for controlling a device for measuring an electric field in a conducting medium, the device comprising:
   two electrodes separated by a volume of an insulating medium;
   a current measurement device;
   a voltage measurement device;
   a switch enabling to alternately connect the current measurement device and the voltage measurement device between the electrodes; and
   a control and processing unit,
   the method comprising a calibration phase comprising the steps of:
   a) controlling the switch to connect the current measurement device between the electrodes, and measuring current I between the electrodes by means of the current measurement device; and
   b) controlling the switch to connect the voltage measurement device between the electrodes, and measuring voltage $\Delta V$ between the electrodes by means of the voltage measurement device, and
   the method further comprising an electric field measurement phase comprising the steps of controlling the switch to connect the current measurement device between the electrodes, of measuring current I between the electrodes by means of the current measurement device, and of deducing from current I the electric field E of the conducting medium according to a previously-determined proportionality ratio.

2. The method of claim 1, wherein the calibration phase further comprises the step of calculating an electric field value E from voltage $\Delta V$ measured at step b) by formula $E=\Delta V/L$, L being the distance between electrodes, and calculating a proportionality coefficient $\beta$ between field E and current I measured at step a).

3. The method of claim 1, wherein, during the calibration phase, steps a) and b) are periodically repeated a plurality of times.

4. The method of claim 3, wherein the frequency at which steps a) and b) are repeated is in the range from 1 to 1,000 Hz.

* * * * *

UNITED STATES PATENT AND TRADEMARK OFFICE
CERTIFICATE OF CORRECTION

PATENT NO. : 10,107,845 B2
APPLICATION NO. : 15/045445
DATED : October 23, 2018
INVENTOR(S) : Mathieu Baicry and Matthieu Le Prado Page 1 of 1

It is certified that error appears in the above-identified patent and that said Letters Patent is hereby corrected as shown below:

On the Title Page

Item (73) Assignee, should read as follows:
Commissariat à l'Energie Atomique et aux Energies Alternatives
Paris, France Signed and Sealed this
Twenty-fourth Day of September, 2019

Andrei Iancu
*Director of the United States Patent and Trademark Office*